United States Patent
Hong (10) Patent No.: US 10,622,841 B2
(45) Date of Patent: Apr. 14, 2020

(54) RESONANT MAGNETIC COUPLING WIRELESS POWER TRANSFER SYSTEM WITH CALIBRATION CAPABILITIES OF ITS INDUCTOR-CAPACITOR RESONANT FREQUENCIES

(71) Applicant: NATIONAL CHIAO TUNG UNIVERSITY, Hsinchu (TW)

(72) Inventor: Hao-Chiao Hong, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 250 days.

(21) Appl. No.: 15/878,778

(22) Filed: Jan. 24, 2018

(65) Prior Publication Data
US 2019/0058458 A1 Feb. 21, 2019

(30) Foreign Application Priority Data
Aug. 21, 2017 (TW) ............... 106128204 A (51) Int. Cl.
| | |
|---|---|
| H01F 27/42 | (2006.01) |
| H01F 37/00 | (2006.01) |
| H01F 38/00 | (2006.01) |
| H02J 50/12 | (2016.01) |
| H03J 3/24 | (2006.01) |
| H03J 7/02 | (2006.01) |

(52) U.S. Cl.
CPC ............... H02J 50/12 (2016.02); H03J 3/24 (2013.01); H03J 7/02 (2013.01)

(58) Field of Classification Search
CPC ................ H03J 3/24; H03J 7/02; H02J 50/12
See application file for complete search history.

(56) References Cited

U.S. PATENT DOCUMENTS

| | | |
|---|---|---|
| 7,940,140 B2 | 5/2011 | Zeng et al. |
| 8,508,308 B2 | 8/2013 | Dong et al. |
| 8,766,712 B2 | 7/2014 | Shanan |
| 8,902,009 B1 | 12/2014 | De Bernardinis et al. |
| 8,918,070 B2 | 12/2014 | Shanan |

(Continued)

FOREIGN PATENT DOCUMENTS

CA 2448316 A1 7/2004

OTHER PUBLICATIONS

Mehdi Kiani, Byunghun Lee, Pyungwoo Yeon, Maysam Ghovanloo; A Q-Modulation Technique for Efficient Inductive Power Transmission; IEEE Journal of Solid-State Circuits; vol. 50, Issue 12; Dec. 2015; pp. 2839-2848; First Publication: Jul. 28, 2015.

*Primary Examiner* — Rexford N Barnie
*Assistant Examiner* — Rasem Mourad
(74) *Attorney, Agent, or Firm* — Rosenberg, Klein & Lee (57) ABSTRACT

A resonant magnetic coupling wireless power transfer system with calibration capabilities of the resonant frequencies of its power transmitter(s) and power receiver(s) is disclosed. The system detects the peak voltages of the coil inductors or the resonant capacitors and tunes the resonant capacitors until the detected peak voltages reach their maximal values given proper setup conditions, so as to calibrate the inductor-capacitor (LC) resonance frequencies of the power transmitter(s) and the power receiver(s) in the resonant magnetic coupling wireless power transfer system to achieve the highest power transferred to the load and a high PTE.

18 Claims, 7 Drawing Sheets

(56) References Cited

U.S. PATENT DOCUMENTS

| | | | | |
|---|---|---|---|---|
| 2006/0071632 A1* | 4/2006 | Ghabra | ............... | H02J 50/12 |
| | | | | 320/108 |
| 2011/0080051 A1* | 4/2011 | Lee | ............... | H02J 50/90 |
| | | | | 307/104 |
| 2011/0259953 A1* | 10/2011 | Baarman | ............... | G01F 23/20 |
| | | | | 235/375 |
| 2012/0063505 A1* | 3/2012 | Okamura | ............... | H02J 5/005 |
| | | | | 375/238 |
| 2014/0080409 A1* | 3/2014 | Frankland | ............... | H02J 5/005 |
| | | | | 455/41.1 |

* cited by examiner

RESONANT MAGNETIC COUPLING WIRELESS POWER TRANSFER SYSTEM WITH CALIBRATION CAPABILITIES OF ITS INDUCTOR-CAPACITOR RESONANT FREQUENCIES

This application claims priority for Taiwan patent application no. 106128204 filed on Aug. 21, 2017, the content of which is incorporated by reference in its entirety.

BACKGROUND OF THE INVENTION

Field of the Invention

The present invention relates to a resonant magnetic coupling wireless power transfer system, particularly to a resonant magnetic coupling wireless power transfer system able to automatically calibrate the inductor-capacitor resonant frequencies.

Description of the Related Art

Wireless power transfer (WPT) is a very convenient technology applicable to various portable devices, such as mobile phones, implantable biomedical devices, sensors, and electric vehicles. There are two main specifications involved with a WPT system. One is the power transfer efficiency (PTE), which is the ratio of the power transferred to the load and the supplied power. PTE is smaller than or equal to 1. The other is the maximal transferred power (MTP), which is the maximal power the load receives from the WPT system.

Both the non-resonant magnetic coupling (NRMC) WPT system and the resonant magnetic coupling (RMC) WPT system are popular WPT technologies. The NRMC WPT system cannot achieve a good enough PTE or a satisfying MTP unless the coupling coefficient (k) of the transmitter coil and the receiver coil approaches 1, i.e. when the two coils have similar diameters, and the distance between the coils is far smaller than the diameters of the coils. Therefore, the NRMC WPT system is usually applicable to one-to-one mode only.

On the other hand, in an application environment having a small coupling coefficient, the RMC WPT system can achieve a PTE that the NRMC WPT system can achieve only in an environment with a larger coupling coefficient. In other words, the RMC WPT system can operate in a longer distance using the same coils. Besides, the RMC WPT system does not need coils having similar diameters. Furthermore, one power transmitter can transfer power to several power receivers in the RMC WPT system. The abovementioned features of the RMC WPT system expand the application field of WPT systems.

Although the RMC WPT system has many advantages, however, some practical implementation issues remain. The main issue is that the RMC WPT system needs the resonance frequencies of the inductor-capacitor (LC) tanks on both the power transmitter and the power receiver sides to be accurately controlled to some particular values. A small deviation of the LC resonant frequency would significantly affect the system's PTE and MTP. Nevertheless, intrinsic errors always exist in the electronic components of a circuit, resulting in that the practical performance of the RMC WPT system is much lower than the optimal performance in theory.

A conventional method for calibrating the LC resonant frequency uses an LCR-meter instrument to measure the inductance and capacitance first and then uses a variable capacitor (varactor) to manually compensate for the inaccurate values of the inductors and capacitors. Another frequently-used method is adding matching networks to regulate the equivalent load impedance seen by the transmitter and the equivalent source impedance seen by the receiver. However, intrinsic errors still exist in the components of the matching networks. Canada patent CA2448316 A1 disclosed a calibration method, which measures the maximal and minimal resonant frequencies first and then uses linear interpolation to guess a target control code of a digitally-controlled capacitor, whereby the calibration time is decreased. While being applied to a WPT system, this method needs to measure the circuit parameters of the WPT system beforehand so as to calculate the target value of calibration. Therefore, the technology is laborious and time-consuming in such an application. Besides, the setup environment for calibration is different from that for normal WPT operation. Thus, the calibration environment and the normal WPT operation environment respectively have different parasitic capacitances and different parasitic inductances. As a result, the calibrated resonant frequency of the WPT system is still deviated from the target during normal WPT operation.

Other calibration methods adjust the PLL's oscillation frequency to calibrate the LC resonant frequency in the PLL, including U.S. Pat. No. 7,940,140 B2, U.S. Pat. No. 8,508,308 B2, U.S. Pat. No. 8,902,009 B1, and U.S. Pat. No. 8,766,712 B2. The U.S. Pat. No. 8,918,070 B2 adjusts the LNA oscillation frequency to calibrate the LC resonant frequency in it. To the best of our knowledge, there has not yet been a dedicated calibration technology developed to calibrate the resonant frequencies of the WPT system and to enhance the performance thereof.

Accordingly, the present invention proposes a RMC WPT system able to automatically calibrate its LC resonant frequencies to address the abovementioned issues.

SUMMARY OF THE INVENTION

The primary objective of the present invention is to provide a RMC WPT system able to automatically calibrate the resonant capacitors of the transmitter and the receiver and precisely control the LC resonant frequencies of the transmitter and the receiver, whereby to wirelessly transfer the maximal power to the load.

Another objective of the present invention is to provide a RMC WPT system, which can achieve a high (sub-optimal) PTE and the MTP simultaneously, and which can further cooperate with the optimal equivalent load resistor to achieve the optimal PTE.

To achieve the abovementioned objectives, the present invention proposes a RMC WPT system with calibration capabilities of its LC resonant frequencies, which comprises a power transmitter and at least one power receiver. The power transmitter transfers an alternating-current (AC) power to at least one power receiver. The power transmitter includes at least a power amplifier and an LC resonator. The LC resonator can be equivalent to a circuit including a first resonant capacitor and a primary coil connected in series. While the first resonant capacitor is calibrating, the first resonant capacitor thereof is tuned until the peak voltage of a primary-side-observation (PSO) voltage achieves its maximal value, whereby the first resonant capacitor achieves its optimal capacitance value enabling the maximal power to be transferred to the load. The PSO voltage is either the voltage across the primary coil or the voltage across the first resonant capacitor.

In one embodiment, the abovementioned power receiver includes a secondary coil and a series resonant load circuit connected in parallel. The series resonant load circuit can be equivalent to be a second resonant capacitor and a load resistor connected in series. A mutual inductance exists between the primary coil and the secondary coil. The mutual inductance can be expressed by a coupling coefficient and the inductances of the two coils.

In another embodiment, the abovementioned power receiver includes a secondary coil and a shunt resonant load circuit connected in parallel. The shunt resonant load circuit can be equivalent to be a second resonant capacitor and a load resistor connected in parallel. A mutual inductance exists between the primary coil and the secondary coil. The mutual inductance can be expressed by a coupling coefficient and the inductances of the two coils.

A process to calibrate the abovementioned first resonant capacitor comprises steps: setting the first resonant capacitor to have an arbitrary initial value, detecting the peak voltage of the PSO voltage, and storing the peak voltage as a first PSO peak voltage (Step S1); adding a predetermined first-resonant-capacitor-incremental (FRCI) step value to the capacitance of the first resonant capacitor (Step S2); detecting the peak voltage of the PSO voltage again, and storing the peak voltage of the detected PSO voltage as a second PSO peak voltage (Step S3); determining whether the absolute value of the difference of the first PSO peak voltage and the second PSO peak voltage is within a predetermined PSO tolerable range; if the difference is within the predetermined PSO tolerable range, stopping the calibration process, and preserving the last value of the first resonant capacitor as the calibration result, else undertaking the next step (Step S4); if the second PSO peak voltage is greater than the first PSO peak voltage, adding a predetermined FRCI step value to the capacitance of the first resonant capacitor, else subtracting a predetermined FRCI step value from the capacitance of the first resonant capacitor (Step S5); replacing the value of the first PSO peak voltage with the value of the second PSO peak voltage, returning to Step S3, and undertaking the steps in sequence (Step S6).

In one embodiment, while the first resonant capacitor is being calibrated, the secondary coil may be in an open-circuit or a short-circuit state. Alternatively, the whole power receiver is removed before the first resonant capacitor is being calibrated to emulate the open-circuit state of the secondary coil. Thereby, the first resonant capacitor is calibrated to have a specified value ready for being used in calibrating the second resonant capacitor.

The present invention further undertakes a process to calibrate the abovementioned second resonant capacitor to achieve the sub-optimal PTE. While the second resonant capacitor is being calibrated, the second resonant capacitor thereof is tuned until the peak voltage of a secondary-side-observation (SSO) voltage achieves its maximal value, whereby the second resonant capacitor achieves its optimal value enabling the power to be transferred to the load with the sub-optimal PTE. The SSO voltage is the voltage across the secondary coil or the voltage across the second resonant capacitor.

The process to calibrate the second resonant capacitor comprises steps: setting the second resonant capacitor to have an initial value, detecting the peak voltage of the SSO voltage, and storing the peak voltage as a first SSO peak voltage (Step S1); adding a predetermined second-resonant-capacitor-incremental (SRCI) step value to the capacitance of the second resonant capacitor (Step S2); detecting the SSO voltage again, and storing its peak voltage as a second SSO peak voltage (Step S3); determining whether the absolute value of the difference of the first SSO peak voltage and the second SSO peak voltage is within a predetermined SSO tolerable range; if the absolute value of the difference is within the predetermined SSO tolerable range, stopping the calibration process, and preserving the last value of the second resonant capacitor as the calibration result, else undertaking the next step (Step S4); if the second SSO peak voltage is greater than the first SSO peak voltage, adding a predetermined SRCI step value to the capacitance of the second resonant capacitor, else subtracting a predetermined SRCI step value from the capacitance of the second resonant capacitor (Step S5); replacing the first SSO peak voltage with the second SSO peak voltage, returning to Step S3, and undertaking the steps in sequence (Step S6).

Below, embodiments are described in detail in cooperation with the attached drawings to make easily understood the objectives, technical contents, and accomplishments of the present invention.

DETAILED DESCRIPTION OF THE INVENTION

The present invention proposes an RMC WPT system with calibration capabilities of its LC resonant frequencies, which can calibrate the resonant capacitors to achieve the maximal peak voltages in an appropriate calibration environment, whereby to realize the target of self-calibration. The present invention may be a series-loaded RMC WPT system or a shunt-loaded RMC WPT system. No matter which type of system the present invention is applied to, the technical spirit thereof is identical.

Figure 1:
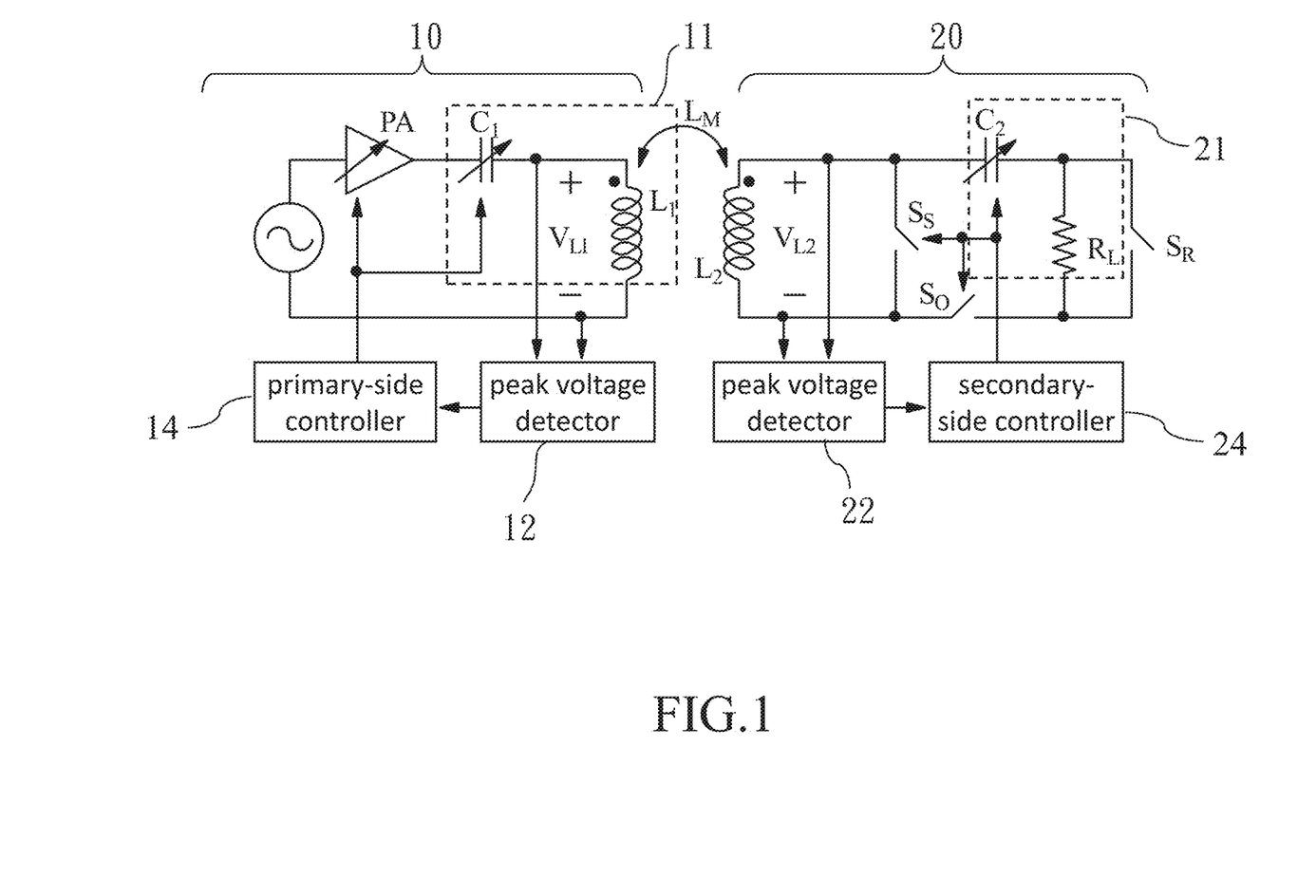
FIG. 1 is a diagram schematically showing the circuit of a series-loaded RMC WPT system with calibration capabilities of its LC resonant frequencies according to one embodiment of the present invention.

Refer to FIG. 1. One embodiment of the present invention proposes a series-loaded RMC WPT system with calibration capabilities of its LC resonant frequencies, which comprises at least one power transmitter 10. The power transmitter 10 includes a power amplifier PA for driving an LC resonator 11. The equivalent circuit of the LC resonator 11 at least includes a first resonant capacitor $C_1$ and a primary coil $L_1$ connected in series with each other. Two ends of the primary coil $L_1$ generate a primary-side observation (PSO) voltage $V_{L1}$. The PSO voltage $V_{L1}$ may be defined as the voltage across the first resonant capacitor $C_1$, too. The power transmitter 10 transfers alternating-current (AC) power to at least one power receiver 20. The power receiver 20 includes a secondary coil $L_2$ and a resonant load circuit connected in parallel. In this embodiment, the resonant load circuit is a series resonant load circuit 21. The equivalent circuit of the series resonant load circuit 21 at least includes a second resonant capacitor $C_2$ and an equivalent load resistor $R_L$ connected in series. Two switches $S_S$ and $S_O$ are electrically connected with the secondary coil $L_2$ and the series resonant load circuit 21. The switch $S_S$ is connected in parallel with the series resonant load circuit 21. The switch $S_O$ is connected in series with the series resonant load circuit 21. An additional switch $S_R$ is connected in parallel with the equivalent load resistor $R_L$. The switch $S_S$ and the switch $S_R$ are always off during normal WPT operation. The switch $S_O$ is always on during normal WPT operation. The power receiver 20 generates a secondary-side-observation (SSO) voltage $V_{L2}$, which may be either the voltage across the secondary coil $L_2$ or the voltage across the second resonant capacitor $C_2$. A mutual inductance $L_M$ exists between the primary coil $L_1$ and the secondary coil $L_2$. The mutual inductance can be expressed by a relationship involving a coupling coefficient k and the inductances ($L_1$ and $L_2$, respectively) of the two coils. During the first resonant capacitor $C_1$ is being calibrated (in a calibration mode), the first resonant capacitor $C_1$ is tuned until the peak voltage of the PSO voltage $V_{L1}$ achieves its maximal value. In such a case, the calibrated capacitance of the first resonant capacitor $C_1$ has an optimal value for transferring the maximal power to the load in the designated power receiver 20, no matter what values the parameters of the elements of the power receiver 20 are given. The power transmitter 10 further includes a peak voltage detector 12. The peak voltage detector 12 is electrically connected with the primary coil $L_1$ or the first resonant capacitor $C_1$ and used to detect the peak voltages of the PSO voltage $V_{L1}$.

A primary-side controller 14 is electrically connected with the peak voltage detector 12, receiving and storing the peak voltages, and tuning the first resonant capacitor $C_1$ according to the values of the peak voltages. The primary-side controller 14 also controls the equivalent output resistance of the power amplifier PA in the calibration mode. Similarly, the power receiver 20 also includes a peak voltage detector 22. The peak voltage detector 22 is electrically connected with the secondary coil $L_2$ or the second resonant capacitor $C_2$ and used to detect the peak voltages of the SSO voltage $V_{L2}$. A secondary-side controller 24 is electrically connected with the peak voltage detector 22, receiving and storing the peak voltages and tuning the second resonant capacitor $C_2$ according to the values of the peak voltages. The secondary-side controller 24 also controls the operations of the switches $S_S$, $S_O$, and $S_R$ according to the operation mode.

Figure 2:
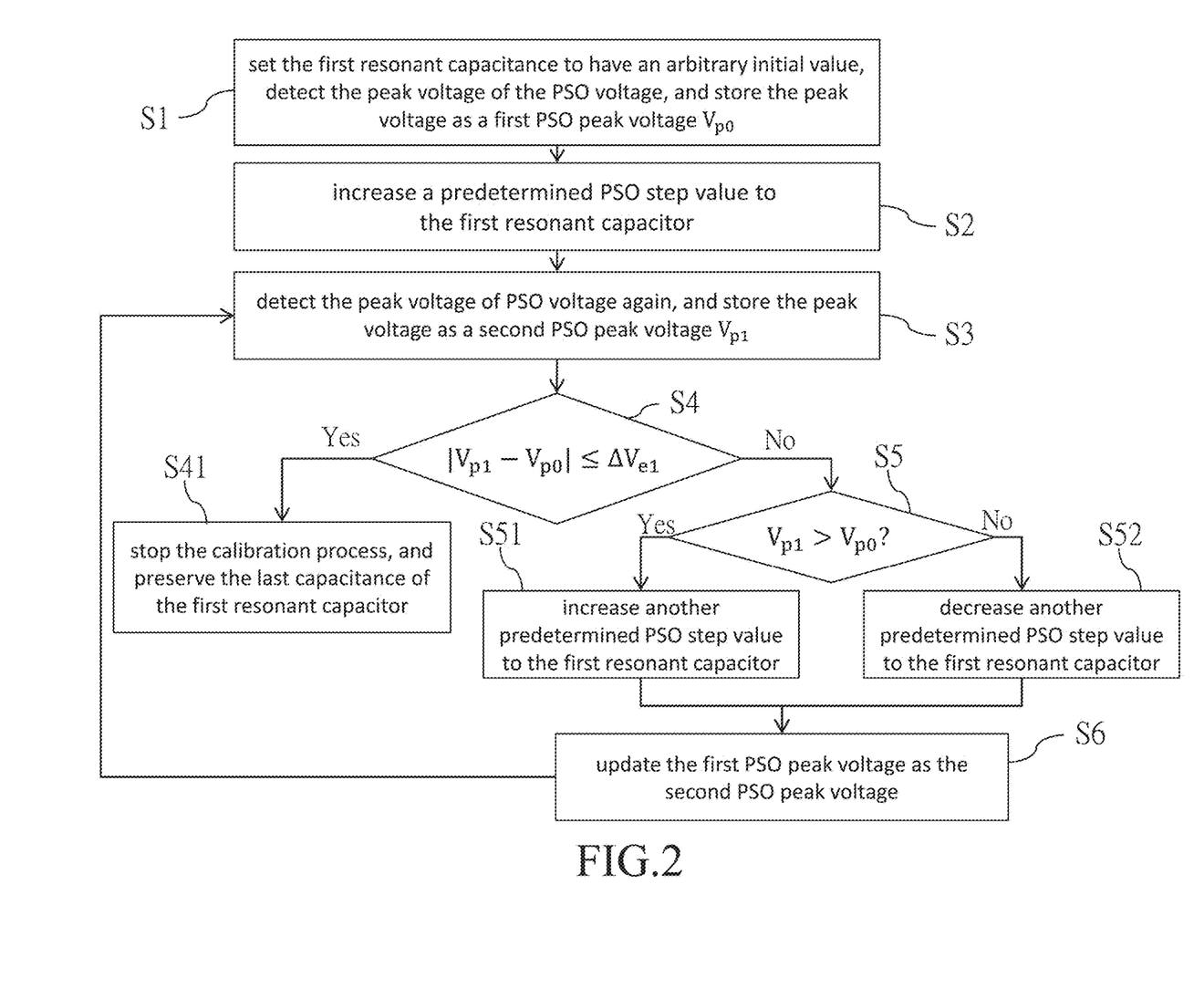
FIG. 2 is a flowchart of calibrating a first resonant capacitor of a power transmitter according to one embodiment of the present invention.

The process to calibrate the first resonant capacitor $C_1$ comprises the steps shown in FIG. 2. In Step S1, set the first resonant capacitor $C_1$ to have an arbitrary initial value, detect the peak voltage of the PSO voltage, and store the peak voltage as a first PSO peak voltage $V_{P0}$. In Step S2, add a predetermined FRCI step value $\Delta C_1$ to the first resonant capacitor $C_1$. In Step S3, detect the peak voltage of the PSO voltage again, and store the peak voltage as a second PSO peak voltage $V_{P1}$. In Step S4, determine whether the absolute value of the difference of the first PSO peak voltage $V_{P0}$ and the second PSO peak voltage $V_{P1}$ is within a predetermined PSO tolerable range $\Delta V_{e1}$. If the difference is within the predetermined PSO tolerable range $\Delta V_{e1}$, undertake Step S41. In Step S41, stop the calibration process, and preserve the last capacitance of the first resonant capacitor $C_1$ as the calibration result. If the difference is not within the predetermined PSO tolerable range $\Delta V_{e1}$, undertake Step S5. In Step S5, determine whether the second PSO peak voltage $V_{P1}$ is greater than the first PSO peak voltage $V_{P0}$. If the second PSO peak voltage $V_{P1}$ is greater than the first PSO peak voltage $V_{P0}$, undertake Step S51. In Step S51, add a predetermined FRCI step value $\Delta C_1$ to the first resonant capacitor $C_1$. If the second PSO peak voltage $V_{P1}$ is smaller than the first PSO peak voltage $V_{P0}$, undertake Step S52. In Step S52, subtract another predetermined FRCI step $\Delta C_1$ from the first resonant capacitor $C_1$. The predetermined FRCI step $\Delta C_1$ may be dynamically adjusted according to the difference of the first PSO peak voltage $V_{P0}$ and the second PSO peak voltage $V_{P1}$. In Step S6, replace the value of the first PSO peak voltage $V_{P0}$ with that of the second PSO peak voltage $V_{P1}$, return to Step S3, and undertake the steps in sequence. The abovementioned calibration process can acquire the optimal capacitance of the first capacitor $C_1$ for transferring the maximal power to the load. If the predetermined PSO tolerable range $\Delta V_{e1}$ is set to zero, the calibration process will be undertaken persistently to track any change of the parameters of the system.

Each of the first resonant capacitor $C_1$ and the second resonant capacitor $C_2$ is a digitally-controlled variable capacitor or a voltage-controlled variable capacitor. While the first resonant capacitor $C_1$ is being calibrated to have a specified value needed in calibrating the second resonant capacitor $C_2$, the secondary coil $L_2$ is in a short-circuit state or an open-circuit state.

In a non-short-circuit and non-open-circuit state, the calibration result of the first resonant capacitor $C_1$ is the optimal value for the load state at the time of calibration.

Refer to FIG. 1 again for the detailed demonstration of the abovementioned statement. While the control switch $S_S$ is turned on, the secondary coil $L_2$ is in a short-circuit state, whereby the first resonant capacitor $C_1$ is ready for calibration. At the same time, the switches $S_O$ and $S_R$ may be turned on or off. Alternatively, the control switch $S_S$ is turned off and the switch $S_O$ is turned off, whereby the secondary coil $L_2$ is in an open-circuit state and ready for calibration. At the same time, the switch $S_R$ may be turned on or off. For the power transmitter, driving the secondary coil $L_2$ in an open-circuit state is the same as driving without the entire power receiver 20. Therefore, the switch $S_O$ is not a necessary but an optional element.

For the RMC WPT system with calibration capabilities of its LC resonant frequencies shown in FIG. 1, in addition to the first resonant capacitor $C_1$, the second resonant capacitor $C_2$ of the series-loaded power receiver 20 can also be calibrated in a calibration mode to achieve a high (sub-optimal) PTE. When calibrating the second resonant capacitor $C_2$, the second resonant capacitor $C_2$ is tuned until the peak voltage of the SSO voltage reaches its maximal value. The SSO voltage is the voltage across the secondary coil $L_2$ or that across the second resonant capacitor $C_2$.

The process to calibrate the second resonant capacitor $C_2$ in FIG. 1 is essentially identical to the process to calibrate the first resonant capacitor $C_1$ shown in FIG. 2 except that the SSO voltage is detected during calibrating the second resonant capacitor $C_2$ and a first SSO peak voltage $V_{R0}$ and a second SSO peak voltage $V_{R1}$ are sequentially detected as the first PSO peak voltage $V_{P0}$ and the second PSO peak voltage $V_{P1}$ are respectively for the succeeding calibration process. Further, in Step S4, it is determined whether the absolute value of the difference of the first SSO peak voltage $V_{R0}$ and the second SSO peak voltage $V_{R1}$ is within a predetermined SSO tolerable range $\Delta_{e2}$. Therefore, the process to calibrate the second resonant capacitor $C_2$ will not be repeated herein. When calibrating the second resonant capacitor $C_2$, the resistance of the equivalent load resistor $R_L$ of the power receiver 20 can be set to be zero via controlling the parallel switch $S_R$. It is premised that before calibrating the second resonant capacitor $C_2$, the first resonant capacitor $C_1$ has been calibrated under the condition that the secondary coil $L_2$ is in a short-circuit state or an open-circuit state. In order to further reduce the error of the calibration result of the second resonant capacitor $C_2$ and to acquire the optimal capacitance of the second resonant capacitor $C_2$, the coupling coefficient k of the primary coil $L_1$ and the secondary coil $L_2$ can be set to a sufficiently-small value, and/or the equivalent output resistance of the power amplifier PA can be increased during the calibration.

Figure 3:
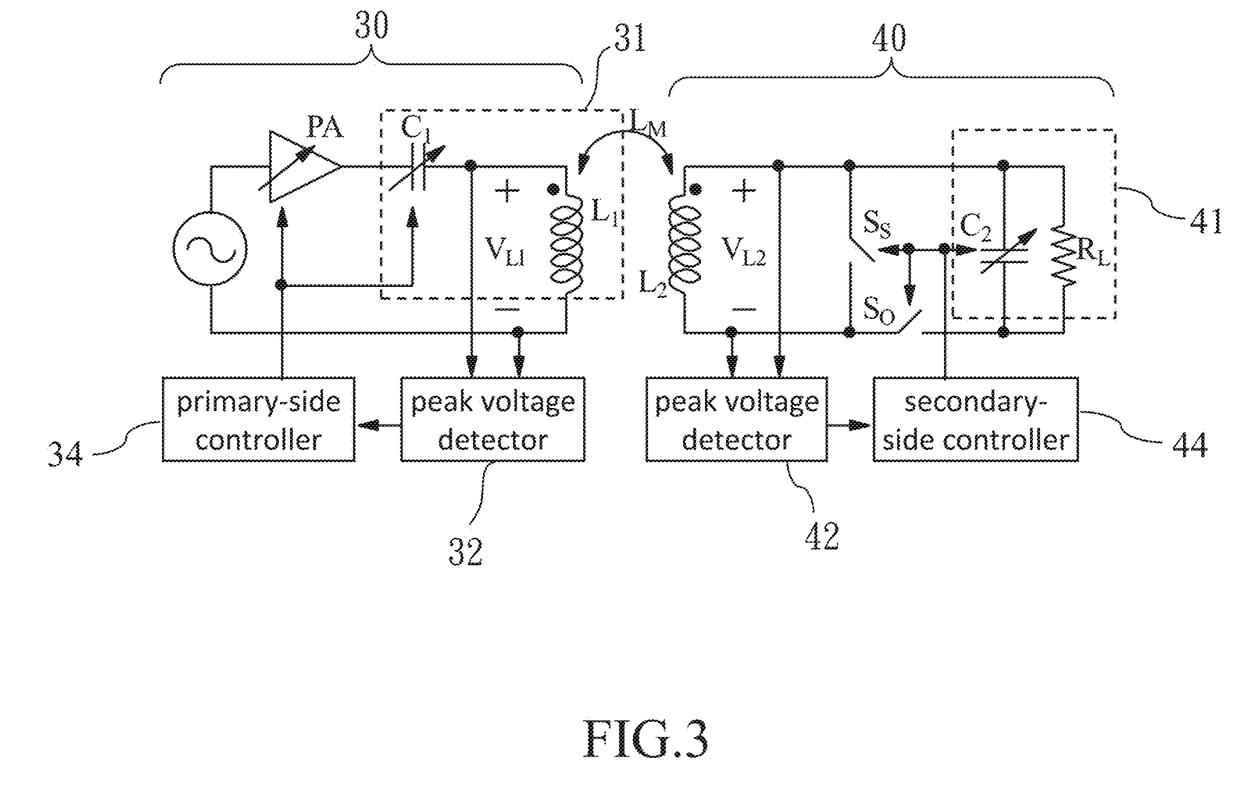
FIG. 3 is a diagram schematically showing the circuit of a shunt-loaded RMC WPT system with calibration capabilities of its LC resonant frequencies according to one embodiment of the present invention.

Refer to FIG. 3. Another embodiment of the present invention proposes a shunt-loaded RMC WPT system with calibration capabilities of its LC resonant frequencies, which comprises at least one power transmitter 30. The power transmitter 30 includes a power amplifier PA and an LC resonator 31. The equivalent circuit of the LC resonator 31 at least includes a first resonant capacitor $C_1$ and a primary coil $L_1$ connected in series with each other. The primary coil $L_1$ generates a PSO voltage $V_{L1}$ across itself. The PSO voltage $V_{L1}$ can be the voltage across the first resonant capacitor $C_1$ as well. The power transmitter 30 transfers AC power to at least one power receiver 40. The power receiver 40 includes a secondary coil L2 and a resonant load circuit which is a shunt resonant load circuit 41. The equivalent circuit of the shunt resonant load circuit 41 at least includes a second resonant capacitor $C_2$ and an equivalent load resistor $R_L$ connected in parallel. Two switches $S_S$ and $S_O$ are electrically connected with the secondary coil $L_2$ and the shunt resonant load circuit 41. The switch $S_S$ is connected in parallel with the second resonant capacitor $C_2$ and the equivalent load resistor $R_L$. The switch $S_O$ is an optional element and connected in series with the shunt resonant load circuit 41. The switch $S_S$ is always off and the switch $S_O$ is always on during normal WPT operation. Two ends of the secondary coil $L_2$ generate a SSO voltage $V_{L2}$. A coupling coefficient k (representing the mutual inductance $L_M$) exists between the primary coil $L_1$ and the secondary coil $L_2$. While the first resonant capacitor $C_1$ is being calibrated, the first resonant capacitor $C_1$ is tuned until the peak voltage of the PSO voltage $V_{L1}$ achieves its maximal value. In such a case, the calibrated first resonant capacitor $C_1$ has the optimal value for transferring the maximal power to the load in the designated power receiver 40 no matter what values the parameters of the components of the power receiver 40 have.

The power transmitter 30 further includes a peak voltage detector 32. The peak voltage detector 32 is electrically connected with the primary coil $L_1$ or the first resonant capacitor $C_1$ and used to detect the peak voltage of the PSO voltage $V_{L1}$. A primary-side controller 34 is electrically connected with the peak voltage detector 32, receiving and storing the peak voltages and tuning the first resonant capacitor $C_1$ according to the values of the peak voltages. The primary-side controller 34 also controls the equivalent output resistance of the power amplifier PA in the calibration mode. Similarly, the power receiver 40 also includes a peak voltage detector 42. The peak voltage detector 42 is electrically connected with the secondary coil $L_2$ or the second resonant capacitor $C_2$ and used to detect the peak voltages of the SSO voltage $V_{L2}$. A secondary-side controller 44 is electrically connected with the peak voltage detector 42, receiving and storing the peak voltages of the SSO voltage $V_{L2}$ and tuning the second resonant capacitor $C_2$ according to the peak voltages of the SSO voltage $V_{L2}$. The secondary-side controller 44 also controls the operations of the switches $S_S$ and So according to the operation mode.

In the system architecture shown in FIG. 3, although the connections of the circuits in the power receiver 40 are different from that of the power receiver 20 shown in FIG. 1, the operation and the calibration process of the first resonant capacitor $C_1$ and the second resonant capacitor $C_2$ in FIG. 3 are identical to those described above. Therefore, it may refer to the descriptions made herein before and will not be repeated herein. However, there is an exception: while the second resonant capacitor is being calibrated, the resistance of the equivalent load resistor $R_L$ of the power receiver 40 is not set to be zero but maintained in its original state in the normal WPT operation mode.

After the description of the technical characteristics of the present invention, the theoretical principles of the present invention will be described in detail below, so as to prove that the present invention can achieve the optimal performance of the RMC WPT system via automatically calibrating the resonant capacitors of the power transmitter and the power receiver to optimize the resonant frequencies of the LC resonators thereof (the optimal frequency is not necessarily the carrier wave frequency fc).

As shown in FIG. 1 and FIG. 3, the first resonant capacitor $C_1$ and the primary coil $L_1$ are interchangeable. The switches $S_S$ and $S_R$ are maintained in an off state, and the switch $S_O$ is maintained in an on state in the normal WPT operation mode. The abovementioned switches are for the calibration process only. In the power transmitter, the power amplifier PA drives the primary coil carrying an inductance $L_1$. The equivalent output resistor of the power amplifier PA is adjustable. In the power transmitter, $C_1$ and $L_1$ jointly form an LC resonator. In the power receiver, the secondary coil carrying an inductance $L_2$ receives the AC power via the mutual inductance $L_M$ between $L_1$ and $L_2$ and transfers the received power to the equivalent load resistor $R_L$; $C_2$ and $L_2$ jointly form another LC resonator. While the resonant frequencies of the two LC resonators approach specified frequencies, the RMC WPT system achieves its optimal performance. The mutual inductance $L_M$ can be expressed as $L_M = k\sqrt{L_1 L_2}$, wherein k is defined as the coupling coefficient.

Figure 4:
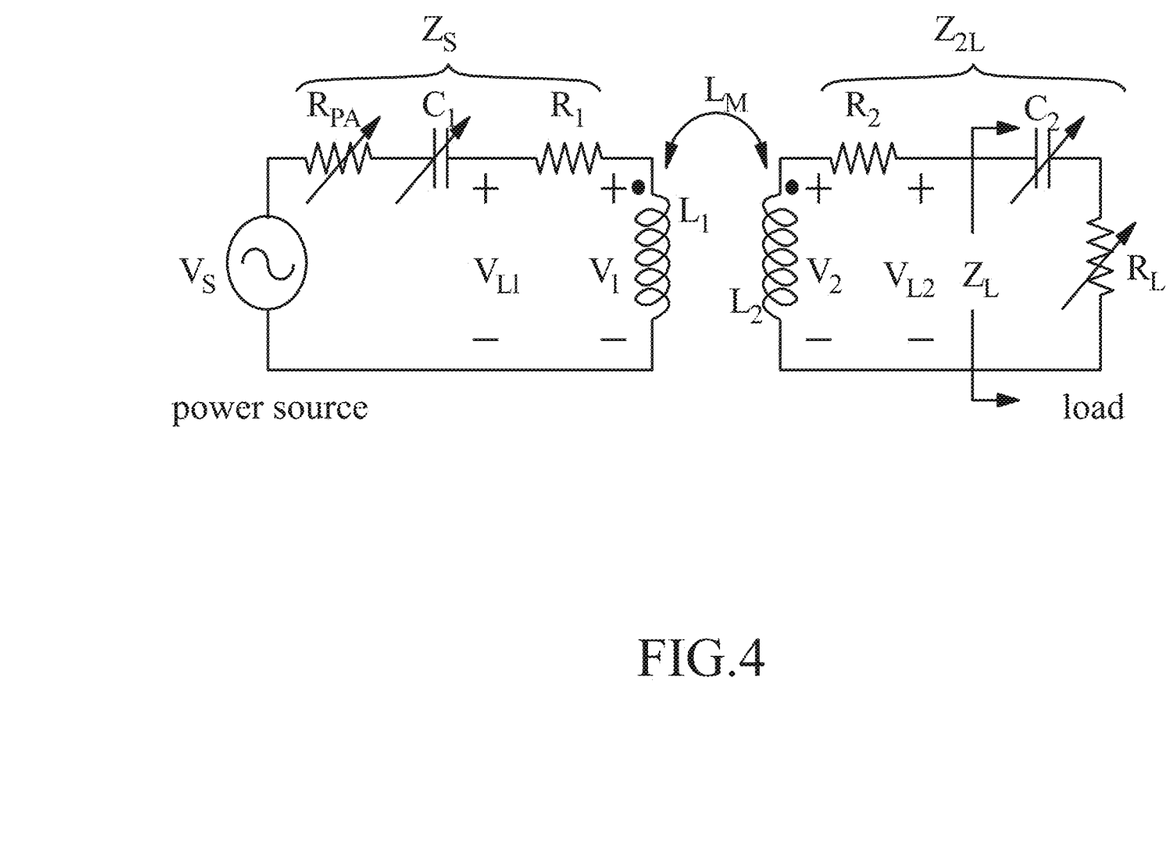
FIG. 4 is a diagram schematically depicting an equivalent circuit of the circuit shown in FIG. 1 according to one embodiment of the present invention.
Figure 5:
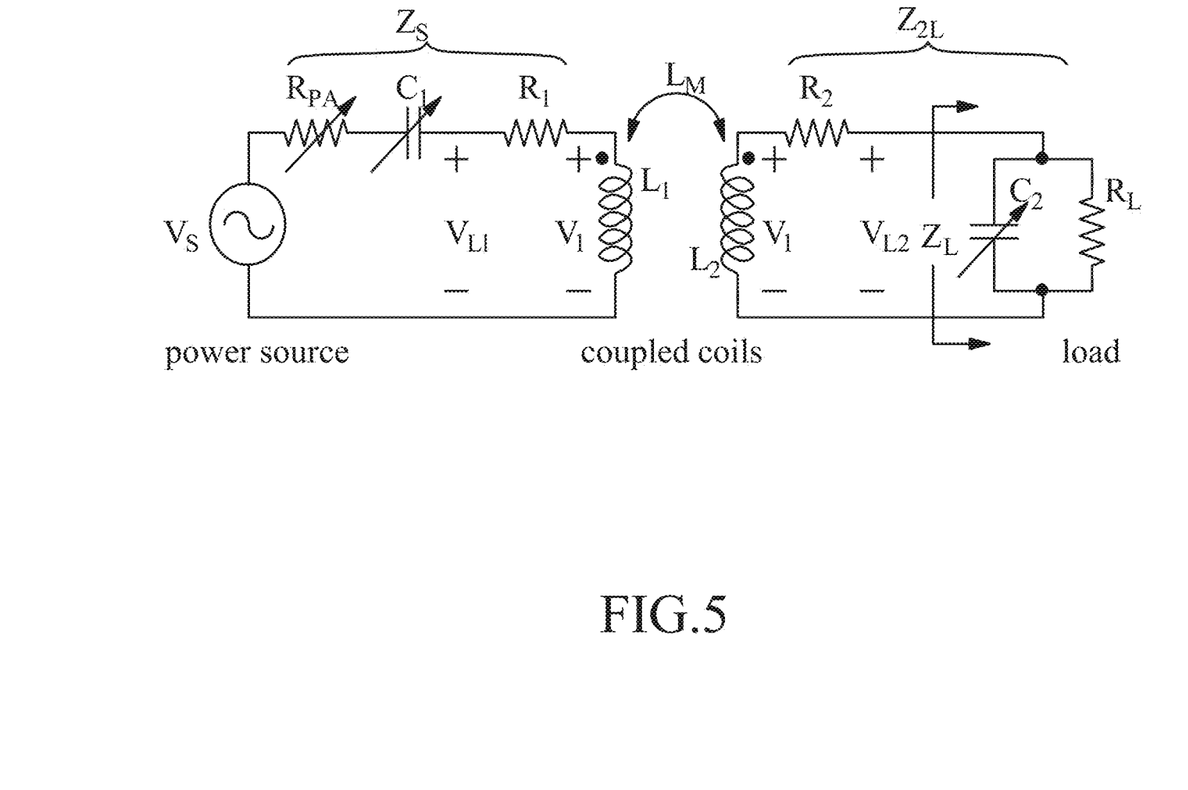
FIG. 5 is a diagram schematically depicting an equivalent circuit of the circuit shown in FIG. 3 according to one embodiment of the present invention.

FIG. 4 and FIG. 5 respectively show the equivalent circuits of the systems shown in FIG. 1 and FIG. 3. The symbols $\omega_c$, $R_{PA}$, $R_L$, $R_1$ and $R_2$ respectively denote the radian frequency of the carrier wave, the equivalent output resistor of the PA, the equivalent load resistor, the parasitic series resistor of the primary coil, and the parasitic series resistor of the secondary coil. The values of $\omega_c$, $R_{PA}$, $R_L$, $R_1$ and $R_2$ are set to be constants in the normal WPT operation mode. Generally speaking, the series-loaded RMC system can transfer power to the load $R_L$ of the power receiver more efficiently when $R_L$ is relatively small, while the shunt-loaded RMC system can transfer power to the load $R_L$ of the power receiver more efficiently when $R_L$ is larger.

Figure 6:
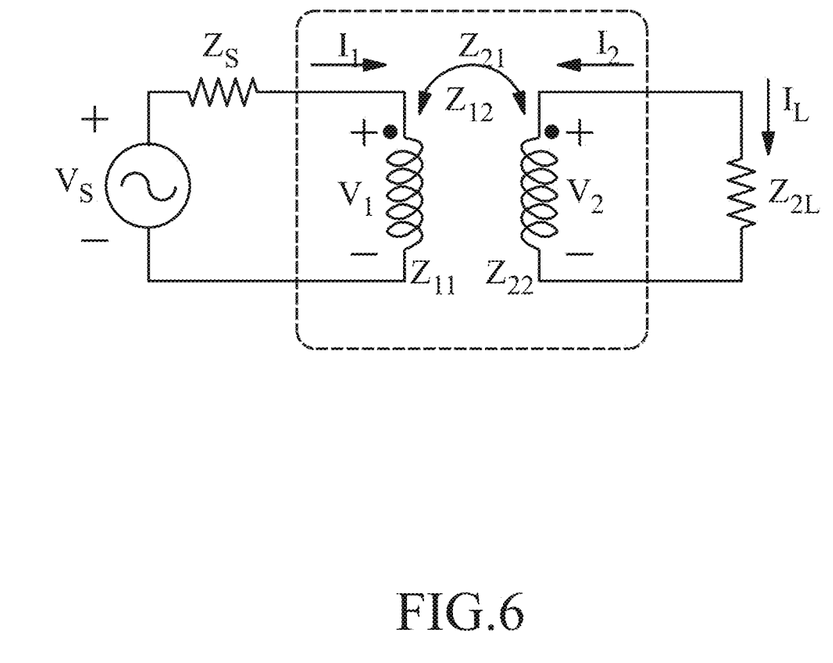
FIG. 6 is a diagram schematically showing a lumped circuit model of FIG. 4 and FIG. 5 according to the embodiments of the present invention.

Both the RMC WPT systems shown in FIG. 4 and FIG. 5 can be expressed by the same lumped circuit model shown in FIG. 6. The parameters of the circuit model in FIG. 6 are listed in Table. 1.

TABLE 1

| | Series-loaded | Shunt-loaded |
|---|---|---|
| $Z_{11}$ | | $j\omega_c L_1$ |
| $Z_{22}$ | | $j\omega_c L_2$ |

TABLE 1-continued

| | Series-loaded | Shunt-loaded |
|---|---|---|
| $Z_{21/12}$ | | $j\omega_c L_M = j\omega_c k\sqrt{L_1 L_2}$ |
| $Z_S$ | | $R_{PA} + R_1 + \dfrac{1}{j\omega_c C_1}$ |
| $Z_L$ | $R_L + \dfrac{1}{j\omega_c C_2}$ | $\dfrac{R_L}{1 + j\omega_c C_2 R_L}$ |
| $Z_{2L}$ | $R_2 + R_L + \dfrac{1}{j\omega_c C_2}$ | $R_2 + \dfrac{R_L}{1 + j\omega_c C_2 R_L}$ |

In the following analysis, the quality factors defined in Table. 2 will be used to express the results of the analysis.

TABLE 2

| Symbol | Definition | Value in a design example and explanations |
|---|---|---|
| $Q_1$ | $\dfrac{\omega_c L_1}{R_1}$ | 150, the quality factor of $L_1$ |
| $Q_2$ | $\dfrac{\omega_c L_2}{R_2}$ | 110, the quality factor of $L_2$ |
| $Q_S$ | $\dfrac{\omega_c L_1}{R_{PA} + R_1}$ | 131, the primary-side quality factor. |
| $Q_L$ | $\dfrac{\omega_c L_2}{R_L}$ | — |
| $Q_{2L}$ | $\dfrac{\omega_c L_2}{R_2 + R_L}$ | — |

Usually, the RMC WPT system cannot achieve good performance unless the quality factors of the two inductors $L_1$ and $L_2$ are much larger than 1. In practical applications, it is demanded: $k^2 Q_S Q_2 \gg 1$.

As will be shown in the following, analyzing the lumped circuit model in FIG. 6 results in: $C_1$ is the only factor to determine the MTP in the condition that k, $C_2$, and $R_L$ are given and remained unchanged. Therefore, the maximal load power ($P_L$) can be achieved via tuning $C_1$ to its optimal value. On the other hand, the analysis results also show: the PTEs of both the RMC WPT systems depend on their $C_2$ and $R_L$ and are independent of their $C_1$. Therefore, the system can achieve the maximal PTE via tuning $C_2$ to the optimal value given that $R_L$ is kept at a fixed value. Table. 3 lists the optimal design values of the RMC WPT system according to the analysis.

TABLE 3

| | Optimal $C_2$ for the maximal PTE, denoted as $C_{2,opt}$ | Optimal $R_L$ for the maximal PTE given $C_2 = C_{2,opt}$, denoted as $R_{L,opt}$ | Optimal $C_1$ for the maximal $P_L$ given $C_2 = C_{2,opt}$ and $R_L = R_{L,opt}$, denoted as $C_{1,opt}$ |
|---|---|---|---|
| Series-loaded RMC | $\dfrac{1}{\omega_c^2 L_2}$ | $\omega_c L_2 \left( \dfrac{k^2 Q_S}{\sqrt{1 + k^2 Q_S Q_2} - 1} - \dfrac{1}{Q_2^2} \right)$ | $\dfrac{1}{\omega_c^2 L_1}$ |
| Shunt-loaded RMC | $\dfrac{1}{1 + k^2 \dfrac{Q_S}{Q_2} + \dfrac{1}{Q_2^2}} \dfrac{1}{\omega_c^2 L_2}$ | $\omega_c L_2 \dfrac{k^2 Q_S + Q_2 + \dfrac{1}{Q_2}}{\sqrt{1 + k^2 Q_S Q_2}}$ | $\dfrac{1}{\omega_c^2 L_1}$ |

It can be observed in Table. 3 that the $C_{2,opt}$ of the series-loaded RMC system is independent of $R_L$, k, and the design parameters of the power transmitter. Therefore, $C_2$ can be calibrated in the environment that these parameters have the values different from the values these parameters have in the normal WPT operation environment. The calibration result of $C_2$ is then stored and used in the normal WPT operation mode. In other words, no matter whether the values of $R_L$, k, and the design parameters of the power transmitter are the same as those in the normal WPT operation environment, the correctness of the calibration results would not be affected.

Below will describe a preferred embodiment of calibrating the first resonant capacitor $C_1$ of the RMC WPT system.

In addition to a high PTE, the WPT system also demands a high MTP. The analysis results of the lump model shown in FIG. 6 show that the load power $P_L$ received by the load $R_L$ can be expressed by $$P_L = H_{PL} \times |V_{L1}(C_1)|^2 \qquad (1)$$

wherein $$H_{PL} = \dfrac{k^2 Re\{Z_L\}}{2\omega_c^2 L_1 L_2 \left| \left( \dfrac{Z_{2L}}{Z_{22}} + 1 \right)\left( 1 - j\dfrac{1}{Q_1} \right) - k^2 \right|^2} \qquad (2)$$

Equations (1) and (2) are applicable to both the series-loaded and shunt-loaded RMC WPT systems. Equation (2) depicts that $H_{PL}$ is independent of $C_1$. As a result, the maximal $|V_{L1}(C_1)|$ also generates the maximal $P_L$ according to Equation (1). Therefore, the present invention proposes: automatically tuning $C_1$ to acquire the maximal $|V_{L1}|$. Once the optimal $C_1$ is found, it is denoted by $C_{1,opt}$ and used to provide the maximal power for the $R_L$.

Define $$\dfrac{Z_S}{Z_{11}} + 1 = m_1 - j\dfrac{1}{Q_S} \qquad (3)$$

$$\dfrac{Z_{2L}}{Z_{22}} + 1 = m_2 - jb \qquad (4)$$

wherein

-continued $$m_1 = 1 - \frac{1}{\omega_c^2 L_1 C_1}, \quad (5)$$

$$m_2 = 1 - \frac{\omega_c^2 L_2 C_2}{Q_L^2 + (\omega_c^2 L_2 C_2)^2}, \quad (6)$$

$$b = \frac{Q_L}{Q_L^2 + (\omega^2 L_2 C_2)^2} + \frac{1}{Q_2}$$

for the shunt-loaded RMC system, and $$m_2 = 1 - \frac{1}{\omega_c^2 L_2 C_2}, \quad b = \frac{1}{Q_{2L}} \quad (7)$$

for the series-loaded RMC system.

In order to understand the relationship between $C_1$ and $|V_{L1}|$, Detailed analysis shows that $$\frac{\partial}{\partial C_1}\left|\frac{V_{L1}(C_1)}{V_S}\right| = \frac{H_{dVL1}}{\omega_c^2 L_1 C_1^2} \times (m_1 - m_{10}) \quad (8)$$

wherein $$H_{dVL1} = \left|\frac{V_{L1}(C_1)}{V_S}\right|^4 \frac{-(m_2^2 + b^2)}{(m_2 - k^2)^2 + \frac{m_2^2}{Q_1^2} + b\left(b + \frac{2}{Q_1}k^2\right)} \quad (9)$$

$$m_{10} = \frac{m_2}{m_2^2 + b^2}k^2. \quad (10)$$

Simultaneously define $$C_{10} = \frac{1}{\omega_c^2 L_1\left(1 - \frac{m_2}{m_2^2 + b^2}k^2\right)}. \quad (11)$$

The two kinds of the RMC WPT systems both have the conditions: $H_{dVL1} < 0$ and $b > 0$. By Equations (8), (9), (10), and the two conditions $H_{dVL1} < 0$ and $b > 0$, we have $$\begin{cases} \frac{\partial}{\partial C_1}\left|\frac{V_{L1}(C_1)}{V_S}\right| > 0 \text{ for } C_1 < C_{10} \\ \frac{\partial}{\partial C_1}\left|\frac{V_{L1}(C_1)}{V_S}\right| < 0 \text{ for } C_1 > C_{10} \end{cases} \quad (12)$$

wherein when $$\frac{\partial}{\partial C_1}\left|\frac{V_{L1}(C_1)}{V_S}\right| = 0, C_1 = C_{10}.$$

Equation (12) indicates that $C_{10}$ is the optimal value corresponding to the maximal $|V_{L1}|$, i.e. $C_{10} = C_{1,opt}$. Equation (12) also indicates that when $C_1$ is larger than the optimal value $C_{10}$, the derivative of $|V_{L1}|$ with respect to $C_1$ is negative and if $C_1$ is smaller than the optimal value, the derivative of $|V_{L1}|$ with respect to $C_1$ is positive.

The calibration method of the present invention is based on Equation (12): Varying $C_1$ to detect the slope of $|V_{L1}(C_1)|$ with respect to the $C_1$ and adjust $C_1$ according to the detected slope until the tuned $C_1$ is close to $C_{10}$ which corresponds to the peak value of $$\left|\frac{V_{L1}(C_1)}{V_S}\right|.$$

The detailed process of calibrating $C_1$ is as follows:
1. Set $C_1$ to an arbitrary initial value, detect the peak value of $|V_{L1}(C_1)|$, and store the peak value as $V_{p0}$.
2. Increase the value of C1 by a predetermined FRCI step value $\Delta C_1$, $\Delta C_1$ is assumed to be positive herein to simplify the discussion though it can be negative.
3. Detect the current peak value of $|V_{L1}(C_1)|$, and store the peak value as $V_{p1}$.
4. If the absolute value of the difference of $V_{p1}$ and $V_{p0}$ is smaller than a predetermined PSO tolerable range $\Delta V_{e1}$, the calibration is completed. Store the current value of $C_1$ as the calibration result. If the absolute value is not smaller than the predetermined PSO tolerable range $\Delta V_{e1}$, go to the next step.
5. If $V_{p1} > V_{p0}$, the slope of $|V_{L1}(C_1)|$ with respect to $C_1$ is positive. By Equation (12), it means $C_1 < C_{10}$. Thus, the calibration process increases $C_1$ by another FRCI step having the same sign as $\Delta C_1$, wherein the another FRCI step may be identical to the predetermined FRCI step $\Delta C_1$ or dynamically adjusted according to the difference of $V_{p1}$ and $V_{p0}$ to accelerate the calibration process. If $V_{p1} < V_{p0}$, the slope of $|V_{L1}(C_1)|$ with respect to $C_1$ is negative. It means $C_1 > C_{10}$ by Equation (12). Thus, the calibration process decreases $C_1$ by another FRCI step having the same sign as $\Delta C_1$, wherein the another FRCI step is either identical to the predetermined FRCI step $\Delta C_1$ or dynamically adjusted according to the difference of $V_{p1}$ and $V_{p0}$ to accelerate the calibration process.
6. Update the value of $V_{p0}$ to be $V_{p1}$; return to Step 3, and repeat the steps in sequence.

As have been mentioned in the Step 2 above, $\Delta C_1$ may also be a negative value. While $\Delta C_1$ is negative, increasing a negative value of $\Delta C_1$ is equal to decreasing $|\Delta C_1|$ in the abovementioned Step 2 or Step 5. Similarly, decreasing a negative value of $\Delta C_1$ is equal to increasing $|\Delta C_1|$ in the abovementioned Step 5. Accordingly, the slopes of $|V_{L1}(C_1)|$ with respect to $\Delta C_1$ are also changed in the abovementioned statements. For example, while $V_{p1} > V_{p0}$, the slope of $|V_{L1}(C_1)|$ with respect to $\Delta C_1$ is changed to be a negative value, it indicates that $C_1 > C_{10}$; if $V_{p1} < V_{p0}$, the slope of $|V_{L1}(C_1)|$ with respect to $\Delta C_1$ is changed to be a positive value, it indicates that $C_1 < C_{10}$.

Figure 7:
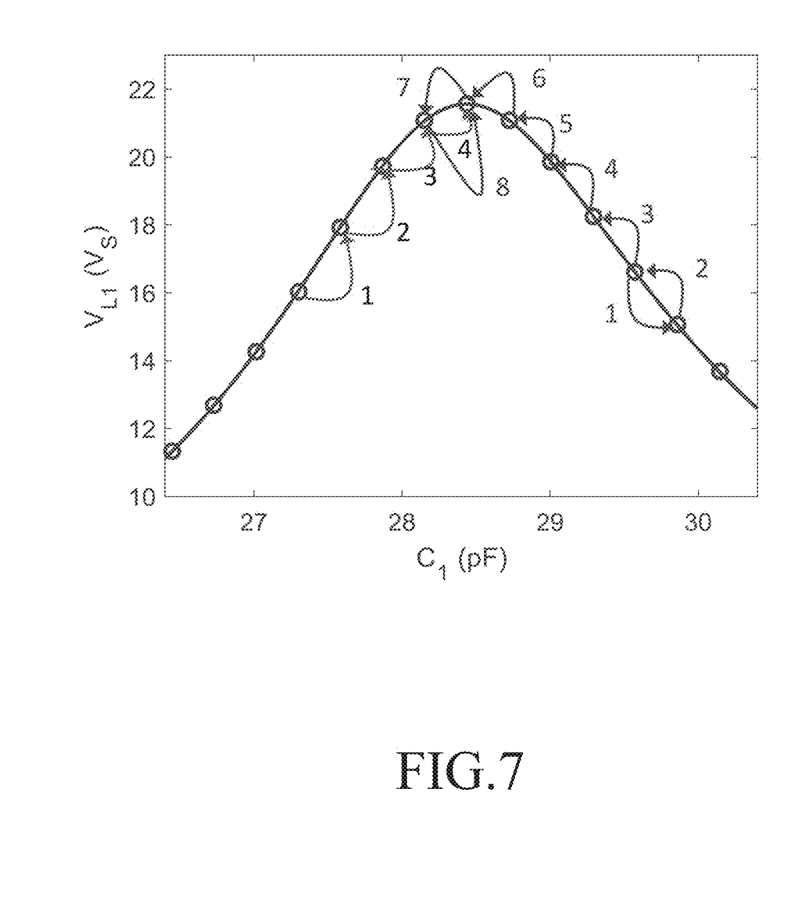
FIG. 7 is a diagram showing a process of calibrating a first resonant capacitor according to one embodiment of the present invention.

FIG. 7 shows two example processes of calibrating $C_1$ using two different initial $C_1$ values. At the end of both calibration processes, the slope of $|V_{L1}(C_1)|$ with respect to $C_1$ approaches zero, whereby the maximal $|V_{L1}(C_1)|$ is acquired. If $\Delta_{e1}$ is set to be zero, the calibration process will be an infinite loop, and the $C_1$, which is being calibrated, will be shifted back and forth within the range of $C_{10} \pm \Delta C_1$ in the long run. It is due to the intrinsic quantization error ($\Delta C_1$) of the variable capacitor. However, using a smaller $\Delta C_1$ can make the calibration result accurate enough.

It is noteworthy that the optimal $C_{10}$ tracks the variation of the coupling coefficient k according to Equation (11), so does the $C_1$ being calibrated in this scenario. Consequently, the power transmitter can persistently provide maximal power to the load $R_L$ against environmental variations.

In addition to calibrating $C_1$ to achieve the highest MTP, the present invention also sets $Z_L=0$ or $Z_L=\infty$ during calibrating $C_1$, so as to set $C_1$ to have a specified value for calibrating $C_2$. The present invention sets $Z_L=0$ via turning on the switch $S_S$ in FIG. 1 and FIG. 3 and leaving the switch $S_O$ being turned on or turned off. The present invention sets $Z_L=\infty$ via turning off the switches $S_O$ and $S_S$ in FIG. 1 and FIG. 3. Alternatively, the present invention can set $Z_L=\infty$ by directly removing the whole power receiver 20/40. This is the reason why the switch $S_O$ is optional. Table. 4 shows the calibration results according to Equation (11).

TABLE 4

| $S_S$ | $S_O$ | Calibration result $C_{10}$ | Comments of $C_{10}$ |
|---|---|---|---|
| off | on | $\dfrac{1}{\omega_c^2 L_1\left(1 - \dfrac{m_2}{m_2^2+b^2}k^2\right)}$ | Optimal $C_1$ for the maximal $P_L$ (MTP) in the normal WPT operation mode. |
| on | on or off | $\dfrac{1}{\omega_c^2 L_1\left(1 - \dfrac{1}{1+\dfrac{1}{Q_2^2}}k^2\right)}$ | calibration result of $C_1$ with $Z_L=0$, which will be used in calibrating $C_2$. |
| off | off | $\dfrac{1}{\omega_c^2 L_1}$ | calibration result of $C_1$ with $Z_L=\infty$, which will be used in calibrating $C_2$. |

A preferred embodiment of calibrating the second resonant capacitor $C_2$ of a shunt-loaded RMC WPT system is described in the following.

For a shunt-loaded RMC system, define $$y = \omega_c^2 L_2 C_2 - 1. \quad (13)$$

Equation (13) is applicable to a shunt-loaded RMC system. In order to understand the relationship between $C_2$ and $|V_{L2}|$. Detailed analysis leads to $$\frac{\partial}{\partial C_2}\left|\frac{V_{L2}}{V_S}\right| = H_{dVL2} \times (y - y_0) \quad (14)$$

wherein $$H_{dVL2} = -\left|\frac{V_{L2}}{V_S}\right|^4 \frac{\omega_c^2 L_1^2}{k^4 L_2}\left((m_1-k^2)^2 + \frac{1}{Q_S^2} + \frac{2k^2}{Q_S Q_2} + \frac{m_1^2 + \frac{1}{Q_2^2}}{Q_2^2}\right) \quad (15)$$

$$y_0 = \frac{k^2(m_1-k^2) - \left(\left(k^2+\dfrac{1}{Q_S Q_2}\right)^2 - k^4 + \dfrac{m_1^2}{Q_2^2}\right)}{(m_1-k^2) + \dfrac{1}{Q_S^2} + \left(k^2+\dfrac{1}{Q_S Q_2}\right)^2 - k^4 + \dfrac{m_1^2}{Q_2^2}}. \quad (16)$$

Simultaneously, define $$C_{20} = \frac{y_0 + 1}{\omega_c^2 L_2} \quad (17)$$

Since $H_{dVL2}<0$, $Q_S>0$, and $Q_2>0$, we have $$\begin{cases} \dfrac{\partial}{\partial C_2}\left|\dfrac{V_{L2}}{V_S}\right| > 0 \text{ for } C_2 < C_{20} \\ \dfrac{\partial}{\partial C_2}\left|\dfrac{V_{L2}}{V_S}\right| < 0 \text{ for } C_2 > C_{20} \end{cases} \quad (18)$$

according to Equations (14) to (17). While $C_2=C_{20}$, $$\frac{\partial}{\partial C_2}\left|\frac{V_{L2}}{V_S}\right| = 0.$$

Equation (18) indicates that $C_{20}$ is the optimal value corresponding to the maximal $|V_{L2}|$. Equation (18) also indicates that while $C_2$ is larger than the optimal value $C_{20}$, the derivative of $|V_{L2}|$ with respect to $C_2$ is negative, and if $C_2$ is smaller than the optimal value $C_{20}$, the derivative of $|V_{L2}|$ with respect to $C_2$ is positive. Because Equation (18) is similar to Equation (12), the method of calibrating $C_2$ is similar to the aforementioned calibration method of $C_1$.

The present invention uses Equation (18) to calibrate $C_2$ to be $C_{20}$ by: Varying $C_2$ and detecting the slope of $|V_{L2}|$ with respect to $C_2$ and tuning $C_2$ according to the detected slope of $|V_{L2}|$ with respect to $C_2$ until $C_2$ is close enough to $C_{20}$ which corresponds to the peak value of $$\left|\frac{V_{L2}}{V_S}\right|.$$

The detailed process of calibrating $C_2$ is as follows:
1. Set $C_2$ to an initial value, detect the peak value of $|V_{L2}|$, and store the peak value as $V_{R0}$.
2. Increase the value of $C_2$ by a predetermined SRCI step value $\Delta C_2$, $\Delta C_2$ is assumed to be positive herein to simplify the discussion though it can be negative.
3. Detect the current peak value of $|V_{L2}|$, and store the peak value as $V_{R1}$.
4. If the absolute value of the difference of $V_{R1}$ and $V_{R0}$ is smaller than a predetermined SSO tolerable range $\Delta V_{e2}$, the calibration is completed. Store the current value of $C_2$ as the calibration result. If the absolute value is not smaller than the predetermined SSO tolerable range $\Delta V_{e2}$, go to the next step.
5. If $V_{R1}>V_{R0}$, the slope of $|V_{L2}|$ with respect to $C_2$ is positive. By Equation (18), it means $C_2<C_{20}$. Thus, the calibration process increases $C_2$ by another SRCI step having the same sign as $\Delta C_2$, wherein the another SRCI step may be identical to the predetermined SRCI step $\Delta C_2$ or dynamically adjusted according to the difference of $V_{R1}$ and $V_{R0}$ to accelerate the calibration process. If $V_{R1}<V_{R0}$, the slope of $|V_{L2}|$ with respect to $C_2$ is negative. It means $C_2>C_{20}$ by Equation (18). Thus, the calibration process decreases $C_2$ by another SRCI step having the same sign as $\Delta C_2$, wherein the another SRCI step is either identical to the predetermined SRCI step $\Delta C_2$ or dynamically adjusted according to the difference of $V_{R1}$ and $V_{R0}$ to accelerate the calibration process.
6. Update the value of $V_{R0}$ to be $V_{R1}$; return to Step 3, and repeat the steps in sequence.

As have been mentioned in the Step 2 above, $\Delta C_2$ may also be a negative value. While $\Delta C_2$ is negative, increasing a negative value of $\Delta C_2$ is equal to decreasing $|\Delta C_2|$ in the abovementioned Step 2 or Step 5. Similarly, decreasing a negative value of $\Delta C_2$ is equal to increasing $|\Delta C_2|$ in the abovementioned Step 5. Accordingly, the slopes of $|V_{L2}|$ with respect to $\Delta C_2$ are also changed in the abovementioned statements. For example, if $V_{R1}>V_{R0}$, the slope of $|V_{L2}|$ with respect to $\Delta C_2$ is changed to be a negative value, it indicates that $C_2>C_{20}$; if $V_{R1}<V_{R0}$, the slope of $|V_{L2}|$ with respect to $\Delta C_2$ is changed to be a positive value, it indicates that $C_2<C_{20}$.

According to Table. 3, in a shunt-loaded RMC WPT system, the optimal $C_2$ that achieves the maximal PTE is $$C_{2,opt} = \frac{1}{1+k^2\frac{Q_S}{Q_2}+\frac{1}{Q_2^2}}\frac{1}{\omega_c L_2} \quad (19)$$

which is independent of $R_L$. As the intended calibration result of $C_2$ is $C_{2,opt}$, $C_1$ must be set to be a specified value during calibration so that $C_{2,opt}=C_{20}$. After the calibration of $C_2$ is completed, $C_2$ will keep the calibrated value in the normal WPT operation mode. As the PTE is independent of $C_1$, the value of $C_1$ in the normal WPT operation mode can be different from the value of $C_1$ used during calibrating $C_2$. Therefore, the two parameters $C_1$ and $R_L$ can be set to any fixed values during calibration. However, for the shunt-loaded RMC WPT system, the parameter k must be the same as that in the application. Consequently, on-line calibration is required.

By equaling Equation (17) and Equation (19), we can set $C_1$ to be $$C_1 \cong \frac{1}{\omega_c^2 L_1(1-k^2)} \text{ or } C_1 = \frac{1}{\omega_c^2 L_1\left(1+\frac{Q_S}{Q_2}\right)} \quad (20)$$

during calibrating $C_2$ to make $C_{2,opt}=C_{20}$.

The second solution in Equation (20) is not preferred because of the difficulties of accurately measuring $Q_S$ and $Q_2$, accurately setting $C_1$, and the need of a larger varactor to implement $C_1$. On the other hand, Table. 4 indicates that calibrating the $C_1$ with $Z_L=0$ results in a value very close to the first solution in Equation (20) without troublesome setup. Given the calibrated $C_1$ and perform the proposed calibration of $C_2$, the error of the calibration result $C_{20}$ normalized to $C_{2,opt}$ can be expressed as $$\frac{C_{20}-C_{2,opt}}{C_{2,opt}} = \frac{-k^2 Q_S Q_2}{Q_2^2+1}. \quad (21)$$

Equation (21) indicates we can further reduce the calibration error by reducing $Q_S$ to a smaller value $Q_{SS}$ during calibrating $C_2$. It can be achieved by increasing $R_{PA}$. There are two simple ways to increase $R_{PA}$ without changing the connections of the circuit: reducing the effective sizes of the output transistor of the PA (the driving capability) or the supply voltage of the PA. Alternatively, interposing an additional resistor to connect in series with the PA and the LC resonator in the primary side during calibration can also reduce $Q_S$.

Firstly, let's define $$Q_{SS}=\lambda Q_S, \text{ wherein } 0<\lambda<1. \quad (22)$$

Thus, the normalized calibration error becomes $$\frac{C_{20}-C_{2,opt}}{C_{2,opt}} = \frac{-k^2 Q_S Q_2}{Q_2^2+1} \times G_{e2cal} \quad (23)$$

wherein the error gain $G_{e2cal}$ $$G_{e2cal} = \frac{2\lambda(1-\lambda)}{\frac{Q_2}{k^2 Q_S}+\frac{1}{k^2 Q_S Q_2}+\lambda}+2\lambda-1. \quad (24)$$

According to Equation (24), setting $\lambda$ to be $\lambda_{opt}$ can completely vanish the calibration error, wherein $$\lambda_{opt} = \frac{Q_2^2+1}{2(Q_2^2+1)+k^2 Q_S Q_2}. \quad (25)$$

Even though we do not accurately set $\lambda$ to be $\lambda_{opt}$, the error gain is still less than 1 as long as $\lambda<1$. In other words, the acquired calibration error is still smaller than the calibration error in the case that $Q_S$ is not reduced.

Table. 4 also indicates that calibrating the $C_1$ with $Z_L=\infty$ results in a C1 whose value close to Equation (20) for loose coupling cases without troublesome setup. Given the calibrated $C_1$ under $Z_L=\infty$ and performing the proposed calibration of $C_2$, the error of the calibration result $C_{20}$ normalized to $C_{2,opt}$ can be expressed by $$\frac{C_{20}-C_{2,opt}}{C_{2,opt}} \cong \frac{-(k^2 Q_S)^2}{1+(k^2 Q_S)^2}. \quad (26)$$

The calibration error is negligible for the loose coupling applications where $k^2 Q_S \ll 1$.

For stronger coupling applications, the calibration error can be further reduced by reducing $Q_S$ to a smaller value $Q_{SS}$ which can be achieved by increasing $R_{PA}$ during calibration. The normalized calibration error of the calibration result $C_{20}$ with respect to $C_{2,opt}$ can be expressed by $$\frac{C_{20}-C_{2,opt}}{C_{2,opt}} = \frac{-k^2 Q_S Q_2(k^2 Q_S Q_2+1)}{Q_2^2+(k^2 Q_S Q_2+1)^2} \times G_{e2cal} \quad (27)$$

wherein the error gain $G_{e2cal}$ is expressed by $$G_{e2cal} = \frac{(k^2 Q_S Q_2 \lambda^2+2\lambda-1)(Q_2^2+(k^2 Q_S Q_2+1)^2)}{(k^2 Q_S Q_2+1)(Q_2^2+(\lambda k^2 Q_S Q_2+1)^2)}. \quad (28)$$

The calibration error vanishes while $\lambda$ is equal to the $\lambda_{opt}$ expressed by Equation (29)

$$\lambda_{opt} = \frac{\sqrt{k^2 Q_S Q_2+1}-1}{k^2 Q_S Q_2}. \quad (29)$$

Even though we cannot accurately set $\lambda$ to be $\lambda_{opt}$, the error gain $G_{e2cal}$ is still less than 1 as long as $\lambda<1$. In other words, the acquired calibration error is still smaller than the calibration error in the case that $Q_S$ is not reduced.

Next describes a preferred embodiment of calibrating the second resonant capacitor $C_2$ of a series-loaded RMC WPT system.

The methods of calibrating the second resonant capacitors $C_2$ of the series-loaded RMC WPT system are similar to those of the shunt-loaded RMC WPT system. However, they are different in that the calibration target $C_{2,opt}$ becomes $$\frac{1}{\omega_c^2 L_2}$$

in the series-loaded system, which has been shown in Table. 3 and is independent of k, $R_L$, and all the design parameters of the power transmitter. Therefore, we can assign k to whatever value during the calibration. The calibration result is stored and applied to practical applications where these parameters may have different values.

The analysis of the series-loaded RMC WPT system using the lumped model shown in FIG. 6 results in $$\frac{\partial}{\partial C_2}\left|\frac{V_{L2}}{V_S}\right| = H_{dVL2} \times (m_2 - m_{21})(m_2 - m_{22}) \quad (30)$$

wherein $$m_{21} < m_{22}, \text{ and} \quad (31)$$

$$H_{dVL2} = \left|\frac{V_{L2}}{V_S}\right|^4 \frac{\omega_c^2 L_1}{k^2 \omega_c^2 L_2^2 C_2^2} \frac{\left(m_1 - \frac{k^2}{2}\right)^2 + \frac{1}{Q_S^2} - \frac{k^4}{4}}{\left((m_2 - 1)^2 + \frac{1}{Q_L^2}\right)^2}.$$

Then, define $$C_{21} = \frac{1}{\omega_c^2 L_2(1 - m_{21})} \quad (32)$$

and $$C_{22} = \frac{1}{\omega_c^2 L_2(1 - m_{22})}. \quad (33)$$

For the loose coupling cases, $$k < \sqrt{\frac{2}{Q_S}},$$

and $H_{dVL2} < 0$. Therefore, $$\begin{cases} \frac{\partial}{\partial C_2}\left|\frac{V_{L2}}{V_S}\right| < 0 \text{ for } C_{22} > C_2 > C_{21} \\ \frac{\partial}{\partial C_2}\left|\frac{V_{L2}}{V_S}\right| > 0 \text{ for } C_2 < C_{21} \text{ or } C_2 > C_{22} \end{cases} \quad (34)$$

If the calibration range of $C_2$ does not cover $C_{22}$, i.e. the initial value of $C_2$ is less than $C_{22}$, Equation (35) is obtained $$\begin{cases} \frac{\partial}{\partial C_2}\left|\frac{V_{L2}}{V_S}\right| < 0 \text{ for } C_2 > C_{21} \\ \frac{\partial}{\partial C_2}\left|\frac{V_{L2}}{V_S}\right| > 0 \text{ for } C_2 < C_{21} \end{cases} \quad (35)$$

Equation (35) is similar to Equation (18). The same calibration procedure can be used to calibrate the second resonant capacitor $C_2$ of the series-loaded RMC system. The calibration result is $C_{21}$. In fact, the only requirement for successfully calibrating $C_2$ to $C_{21}$ is to assign the initial value $C_2$ of the calibration procedure to be less than $C_{22}$ which is an easy task.

In order to achieve $$C_{21} = C_{2,opt} = \frac{1}{\omega_c^2 L_2},$$

$C_1$ needs to be set to Equation (36):

$$\frac{1}{\omega_c^2 L_2 \left(1 - \frac{k^2 Q_{2L}^2}{2}\left(1 + \frac{1}{Q_L^2}\right)\left(1 \pm \sqrt{1 - 4\left(\frac{1 + \frac{1}{k^2 Q_S Q_{2L}}}{1 + \frac{1}{Q_L^2}}\right)^2}\right)\right)}, \quad (36)$$

and $R_L$ is needed to be set to a value that fulfills following equation:

$$0 \leq Q_L < \frac{\sqrt{1 + k^4 Q_S^2} - 1}{k^2 Q_S}. \quad (37)$$

However, it is hard to precisely set the required $C_1$ and $R_L$ in practice.

A simpler calibration setup for calibrating $C_2$ of the series-loaded RMC system is to set $R_L=0$ by turning on the switch $S_R$ in FIG. 1 and setting $C_1$ to the calibrated $C_1$ with $Z_L=0$. This setup leads to $C_{22}=\infty$, which means there is no limit for the initial value of $C_2$. The normalized calibration error of the calibrated $C_2$ with respect to $C_{2,opt}$ using this setup is expressed as $$\frac{C_{21} - C_{2,opt}}{C_{2,opt}} \cong \frac{1}{\left(k^2 \frac{Q_S}{Q_2} + 1\right)^2} - 1. \quad (38)$$

By setting a k satisfying $$k^2 \ll \frac{Q_2}{Q_S}$$

during the calibration of $C_2$, the calibration error becomes negligible.

Similar to the calibration of the shunt-loaded RMC system, the calibration error of $C_2$ can be further reduced via decreasing $Q_S$ to a smaller value $Q_{SS}$. The normalized calibration error with the $Q_{SS}$ becomes $$\frac{C_{21} - C_{2,opt}}{C_{2,opt}} \cong -2k^2 \frac{Q_{SS}}{Q_2} \quad (39)$$

wherein $k^2 \ll \frac{Q_2}{Q_{SS}}$.

Another convenient setup for calibrating $C_2$ of the series-loaded RMC system is to set $R_L=0$ and set $C_1$ to the calibrated $C_1$ under $Z_L=\infty$. The calibration setup also leads to $C_{22}=\infty$, which means there is no limit for the initial value of $C_2$. The normalized calibration error of the calibrated $C_2$ with respect to $C_{2,opt}$ is expressed by $$\frac{C_{21}-C_{2,opt}}{C_{2,opt}}=\frac{-1}{1+\left(\frac{1}{\frac{1}{Q_2}+k^2 Q_S}\right)^2}. \quad (40)$$

It is learned from Equation (40): by setting a small enough k that satisfying $k^2 Q_S \ll 1$ during the calibration of $C_2$, the calibration error also becomes negligible.

The calibration error shown in Equation (40) can be further reduced by reducing $Q_S$ to a smaller value $Q_{SS}$ during the calibration of $C_2$. Thereby, the normalized calibration error is $$\frac{C_{21}-C_{2,opt}}{C_{2,opt}}=\frac{-1}{1+\left(\frac{1}{\frac{1}{Q_2}+k^2 Q_{SS}}\right)^2}, \quad (41)$$

which is always smaller than Equation (40).

Therefore, the present invention can automatically calibrate the resonant capacitors of the power transmitter and the power receiver in an appropriate environmental setting to achieve the maximal peak voltages of the PSO voltage and the SSO voltage so as to achieve the optimal MTP and the sub-optimal PTE, respectively. By further setting the equivalent load resistor to its optimal value listed in Table. 3, the present invention can also achieve the optimal PTE.

Further, the technical characteristics of the present invention can also be applied to the WPT systems using a capacitor/inductor matching network. As long as the circuit architecture is equivalent to the resonant load circuit and the LC resonator, the present invention can be used to tune the capacitances of the equivalent resonant capacitors and calibrate the resonant frequencies of the power transmitter and receiver.

The embodiments described above are only to demonstrate the technical thoughts and characteristics of the present invention to enable the persons skilled in the art to understand, make, and use the present invention but not to limit the scope of the present invention. Any equivalent modification or variation according to the spirit of the present invention is to be also included by the scope of the present invention.

What is claimed is:

1. A resonant magnetic coupling wireless power transfer system with calibration capabilities of its inductor-capacitor resonant frequencies, comprising
    at least one power receiver each at least including a secondary coil and a resonant load circuit; and
    at least one power transmitter transmitting an alternating-current power using a carrier wave to said at least one power receiver, and said power transmitter at least including a power amplifier and an inductor-capacitor (LC) resonator driven by said power amplifier, wherein said LC resonator equivalently includes at least a first resonant capacitor and a primary coil connected in series; a primary-side-observation (PSO) voltage is generated by the primary coil or generated across the first resonant capacitor; during calibrating said first resonant capacitor, said first resonant capacitor is tuned until said PSO voltage's peak voltage reaches its maximal value, and thus said first resonant capacitor achieves its optimal capacitance value, wherein a calibration process of said first resonant capacitor includes steps:
    (S1) setting said first resonant capacitor to an initial value, detecting a peak voltage of said PSO voltage, and storing said peak voltage as a first PSO peak voltage;
    (S2) adding a predetermined first-resonant-capacitor-incremental (FRCI) step value to the capacitance of said first resonant capacitor;
    (S3) detecting said peak voltage of said PSO voltage again, and storing said detected PSO voltage's peak voltage as a second PSO peak voltage;
    (S4) determining whether an absolute value of the difference of said first PSO peak voltage and said second PSO peak voltage is within a predetermined PSO tolerable range; if yes, stopping said calibration process, and preserving the last value of said first resonant capacitor as a calibration result if no, undertaking the next step;
    (S5) if said second PSO peak voltage is greater than said first PSO peak voltage, adding another predetermined FRCI step value to said first resonant capacitor; if said second PSO peak voltage is smaller than said first PSO peak voltage, subtracting another predetermined FRCI step value from said first resonant capacitor; and
    (S6) replacing the value of said first PSO peak voltage with the value of said second PSO peak voltage, returning to Step (S3), and undertaking said steps again in sequence.

2. The resonant magnetic coupling wireless power transfer system with calibration capabilities of its inductor-capacitor resonant frequencies according to claim 1, wherein said resonant load circuit of said power receiver is selected from:
    a series resonant load circuit equivalently including at least a second resonant capacitor and a resistive load connected in series, wherein said secondary coil generates a secondary-side-observation (SSO) voltage; said primary coil and said secondary coil have a coupling coefficient there between; and
    a shunt resonant load circuit equivalently including at least a second resonant capacitor and a resistive load connected in parallel, wherein said secondary coil generates said SSO voltage; said primary coil and said secondary coil have a coupling coefficient there between.

3. The resonant magnetic coupling wireless power transfer system with calibration capabilities of its inductor-capacitor resonant frequencies according to claim 1, wherein in Step (S5), said another predetermined FRCI step value is dynamically adjusted according to said difference of said first PSO peak voltage and said second PSO peak voltage and has the same sign as said predetermined FRCI step value in Step (S2).

4. The resonant magnetic coupling wireless power transfer system with calibration capabilities of its inductor-capacitor resonant frequencies according to claim 1, wherein said first resonant capacitor is a digitally-controlled variable capacitor or a voltage-controlled variable capacitor.

5. The resonant magnetic coupling wireless power transfer system with calibration capabilities of its inductor-capacitor resonant frequencies according to claim 1, wherein while said first resonant capacitor is being calibrated, said secondary coil is in a short-circuit state or an open-circuit state.

6. The resonant magnetic coupling wireless power transfer system with calibration capabilities of its inductor-capacitor resonant frequencies according to claim 1, wherein while said first resonant capacitor is being calibrated, said power receiver is removed beforehand.

7. The resonant magnetic coupling wireless power transfer system with calibration capabilities of its inductor-capacitor resonant frequencies according to claim 1 further comprising a peak voltage detector electrically connected with said primary coil or said first resonant capacitor and used to detect said peak voltage of said PSO voltage.

8. The resonant magnetic coupling wireless power transfer system with calibration capabilities of its inductor-capacitor resonant frequencies according to claim 7 further comprising a primary-side controller electrically connected with said peak voltage detector, receiving and storing said peak voltages of said PSO voltage, and tuning said first resonant capacitor according to said calibration process of said first resonant capacitor.

9. The resonant magnetic coupling wireless power transfer system with calibration capabilities of its inductor-capacitor resonant frequencies according to claim 2, wherein said second resonant capacitor of said power receiver is calibrated to achieve a maximal PTE; while said second resonant capacitor is being calibrated, said first resonant capacitor is set beforehand to have a value obtained by said calibration process of said first resonant capacitor under a condition that said secondary coil is in an open-circuit or a short-circuit state or a condition that said power receiver is removed, and then said second resonant capacitor is tuned until said SSO voltage's peak voltage reaches its maximal value, and thus said second resonant capacitor achieves its optimal value.

10. The resonant magnetic coupling wireless power transfer system with calibration capabilities of its inductor-capacitor resonant frequencies according to claim 9, wherein said second resonant capacitor is a digitally-controlled variable capacitor or a voltage-controlled variable capacitor.

11. The resonant magnetic coupling wireless power transfer system with calibration capabilities of its inductor-capacitor resonant frequencies according to claim 9, wherein a calibration process of said second resonant capacitor includes steps:
(S1) setting said second resonant capacitor to an initial value, detecting a peak voltage of said SSO voltage, and storing said peak voltage as a first SSO peak voltage;
(S2) adding a predetermined second-resonant-capacitor-incremental (SRCI) step value to the capacitance of said second resonant capacitor;
(S3) detecting said SSO voltage's peak voltage again, and storing said detected SSO voltage's peak voltage as a second SSO peak voltage;
(S4) determining whether an absolute value of the difference of said first SSO peak voltage and said second SSO peak voltage is within a predetermined SSO tolerable range; if yes, stopping said calibration process, and preserving the last value of said second resonant capacitor as a calibration result of said second resonant capacitor; if no, undertaking the next step;
(S5) if said second SSO peak voltage is greater than said first SSO peak voltage, adding another predetermined SRCI step value to the capacitance of said second resonant capacitor; if said second SSO peak voltage is smaller than said first SSO peak voltage, subtracting another predetermined SRCI step value from said second resonant capacitor; and
(S6) replacing the value of said first SSO peak voltage with the value of said second SSO peak voltage, returning to Step (S3), and undertaking said steps again in sequence.

12. The resonant magnetic coupling wireless power transfer system with calibration capabilities of its inductor-capacitor resonant frequencies according to claim 11, wherein in Step (S5), said another predetermined SRCI step value is dynamically adjusted according to said difference of said first SSO peak voltage and said second SSO peak voltage and has the same sign as said predetermined SRCI step value in Step (S2).

13. The resonant magnetic coupling wireless power transfer system with calibration capabilities of its inductor-capacitor resonant frequencies according to claim 9, wherein while said resonant load circuit is said series resonant load circuit, said series resonant load circuit's equivalent resistive load has zero resistance during said second resonant capacitor is being calibrated.

14. The resonant magnetic coupling wireless power transfer system with calibration capabilities of its inductor-capacitor resonant frequencies according to claim 9, wherein said coupling coefficient (k) is a sufficiently small value and satisfies $k^2 \ll 1/Q_S$, and wherein $Q_S$ is a quality factor expressed by $$Q_S = \frac{\omega_c L_1}{R_{PA} + R_1},$$

and wherein $\omega_c$ denotes said carrier wave's radian frequency; $L_1$ denotes said primary coil's inductance; $R_{PA}$ denotes said power amplifier's equivalent output resistance; $R_1$ denotes said primary coil's parasitic series resistance.

15. The resonant magnetic coupling wireless power transfer system with calibration capabilities of its inductor-capacitor resonant frequencies according to claim 9, wherein while said second resonant capacitor is being calibrated, said power amplifier's equivalent output resistance is increased.

16. The resonant magnetic coupling wireless power transfer system with calibration capabilities of its inductor-capacitor resonant frequencies according to claim 11 further comprising a peak voltage detector electrically connected with said secondary coil or said second resonant capacitor and used to detect said first and said second peak voltages of said SSO voltage.

17. The resonant magnetic coupling wireless power transfer system with calibration capabilities of its inductor-capacitor resonant frequencies according to claim 16 further comprising a secondary-side controller electrically connected with said peak voltage detector, receiving and storing said peak voltages of said SSO voltage, and tuning said second resonant capacitor according to said calibration process of said second resonant capacitor.

18. The resonant magnetic coupling wireless power transfer system with calibration capabilities of its inductor-capacitor resonant frequencies according to claim 11, wherein while said resonant load circuit of said power receiver is said series resonant load circuit, said initial value of said second resonant capacitor is smaller than said calibration result of said second resonant capacitor.

* * * * *